(12) United States Patent
Hsu et al.

(10) Patent No.: US 11,362,006 B2
(45) Date of Patent: Jun. 14, 2022

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Yao-Wen Hsu, New Taipei (TW); Ming-Chi Huang, Zhubei (TW); Ying-Liang Chuang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/889,160

(22) Filed: Jun. 1, 2020

(65) Prior Publication Data

US 2021/0125877 A1    Apr. 29, 2021

Related U.S. Application Data

(60) Provisional application No. 62/927,461, filed on Oct. 29, 2019.

(51) Int. Cl.
*H01L 21/8238* (2006.01)
*H01L 21/3213* (2006.01)
*H01L 21/28* (2006.01)

(52) U.S. Cl.
CPC ........... *H01L 21/823842* (2013.01); *H01L 21/28088* (2013.01); *H01L 21/32134* (2013.01); *H01L 21/32139* (2013.01); *H01L 21/823821* (2013.01)

(58) Field of Classification Search
CPC ................................................. H01L 21/32139
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2004/0202964 A1 | 10/2004 | Wu et al. | |
| 2010/0068875 A1* | 3/2010 | Yeh | H01L 21/823842 438/587 |
| 2010/0319971 A1 | 12/2010 | Lin | |
| 2012/0305525 A1 | 12/2012 | Lee et al. | |
| 2014/0282326 A1 | 9/2014 | Chen et al. | |
| 2015/0017808 A1 | 1/2015 | Koh | |
| 2016/0013041 A1 | 1/2016 | Liu et al. | |
| 2016/0086860 A1 | 3/2016 | Kannan et al. | |
| 2017/0062349 A1* | 3/2017 | Wang | H01L 23/544 |

FOREIGN PATENT DOCUMENTS

TW    201517124 A    5/2015

* cited by examiner

*Primary Examiner* — Mounir S Amer
(74) *Attorney, Agent, or Firm* — Slater Matsil LLP

(57) ABSTRACT

Semiconductor devices and methods which utilize a treatment process of a bottom anti-reflective layer are provided. The treatment process may be a physical treatment process in which material is added in order to fill holes and pores within the material of the bottom anti-reflective layer or else the treatment process may be a chemical treatment process in which a chemical reaction is used to form a protective layer. By treating the bottom anti-reflective layer the diffusion of subsequently applied chemicals is reduced or eliminated, thereby helping to prevent defects that arise from such diffusion.

20 Claims, 13 Drawing Sheets

SEMICONDUCTOR DEVICE AND METHOD OF MANUFACTURE

PRIORITY CLAIM AND CROSS-REFERENCE

This application claims the benefit of U.S. Provisional Application No. 62/927,461, filed on Oct. 29, 2019 which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
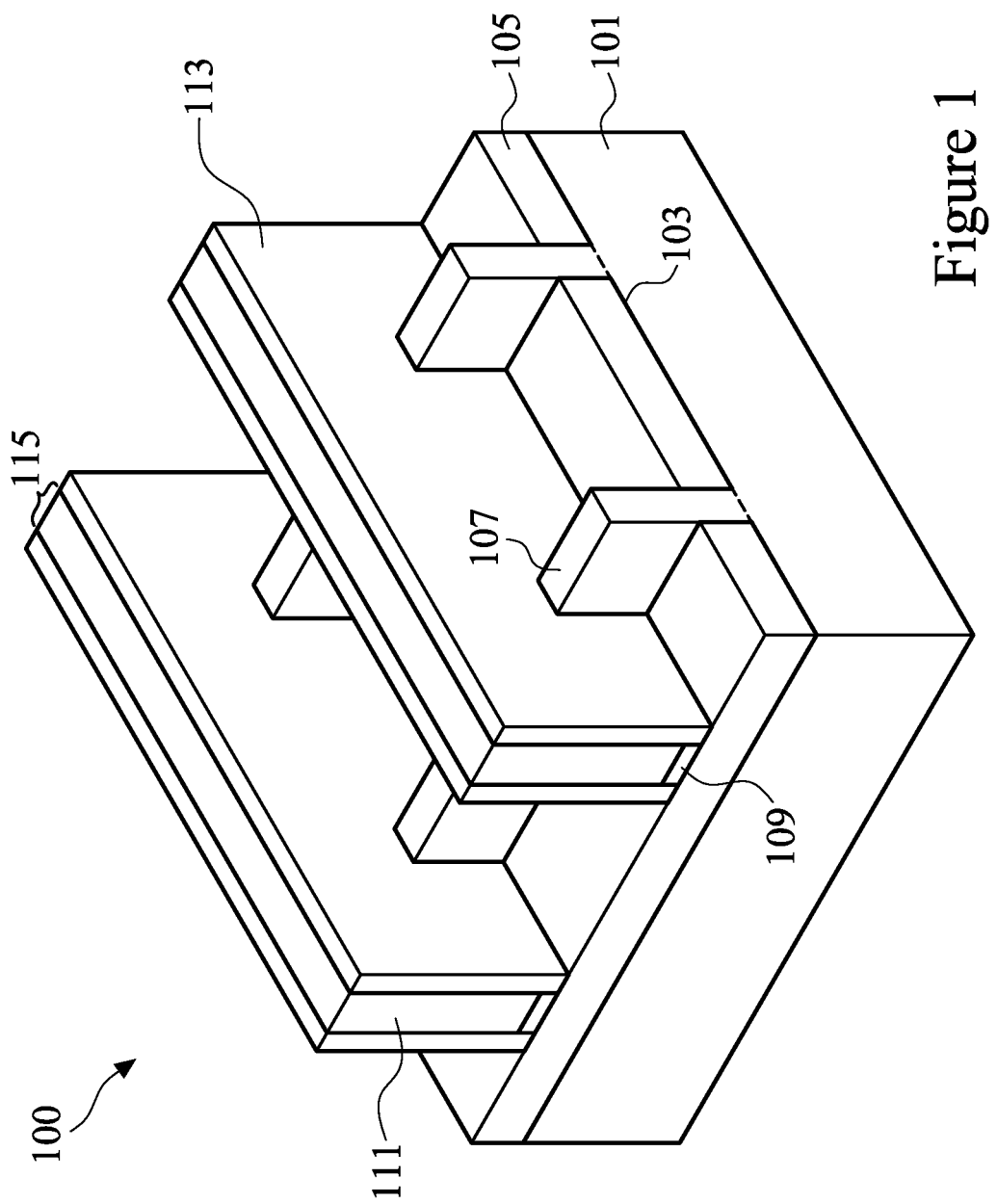
FIG. 1 illustrates a perspective view of a formation of semiconductor fins, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular examples including finFET manufacturing processes with blister prevention and semiconductor devices formed with a reduced number of blisters. However, embodiments are not limited to the examples provided herein, and the ideas may be implemented in a wide array of embodiments.

With reference now to FIG. 1, there is illustrated a perspective view of a semiconductor device 100 such as a finFET device. In an embodiment the semiconductor device 100 comprises a substrate 101 and first trenches 103. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET. While FIG. 1 only illustrates two fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive or non-conductive material and may be selected from a group comprising polysilicon, W, Al, Cu, AlCu, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a thickness of between about 5 Å and about 500 Å. Additionally, once the first spacers 113 have been formed, a first spacer 113 adjacent to one stack 115 may be separated from a first spacer 113 adjacent to another stack 115 by a distance of between about 5 nm and about 200 nm, such as about 20 nm. However, any suitable thicknesses and distances may be utilized.

Figure 2:
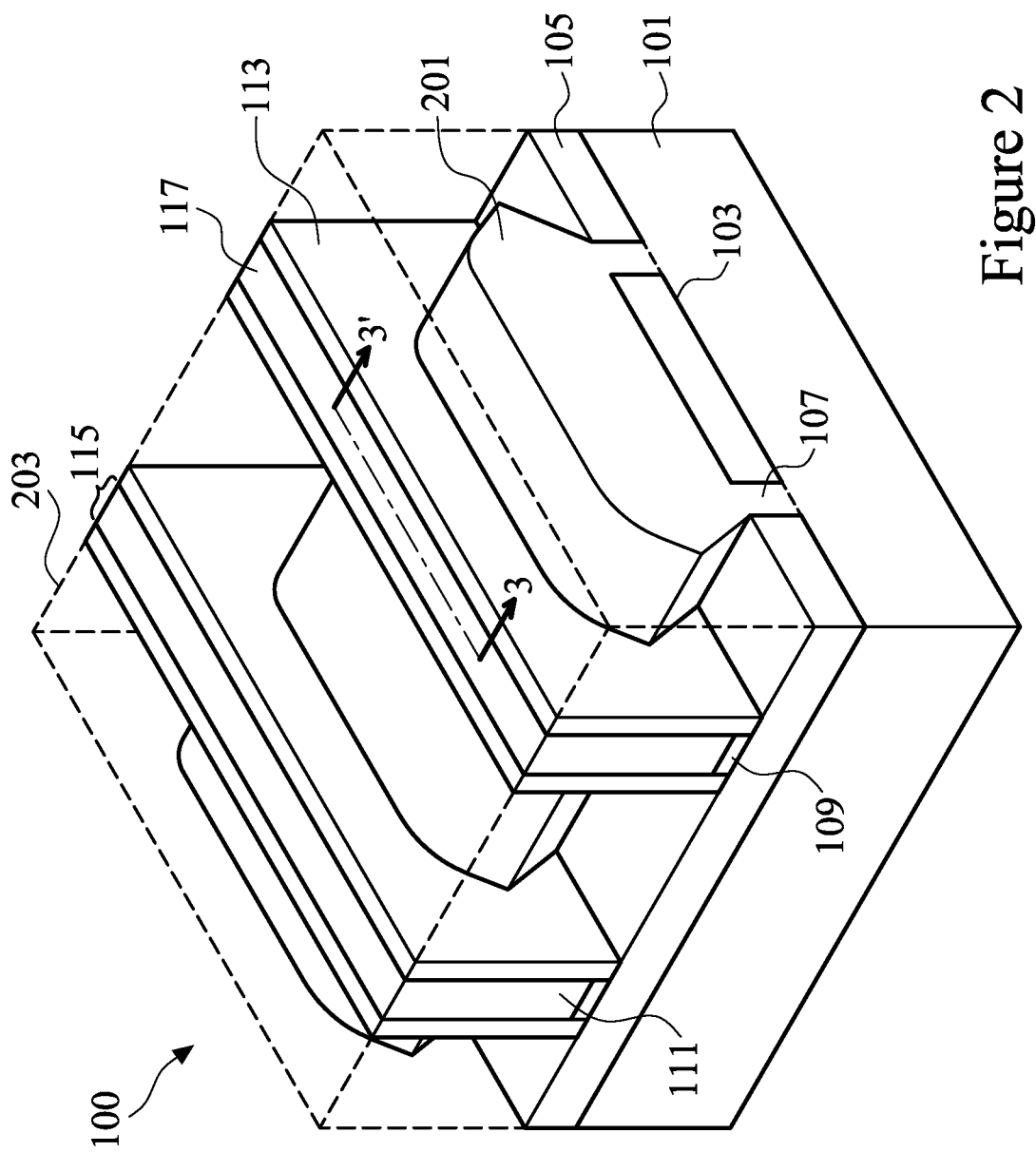
FIG. 2 illustrates formation of source/drain regions, in accordance with some embodiments.

FIG. 2 illustrates a removal of the fins 107 from those areas not protected by the stacks 115 and the first spacers 113 and a regrowth of source/drain regions 201. The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a thickness of between about 5 Å and about 1000 Å and a height over the first isolation regions 105 of between about 10 Å and about 500 Å, such as about 200 Å. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

FIG. 2 also illustrates a formation of an inter-layer dielectric (ILD) layer 203 (illustrated in dashed lines in FIG. 2 in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

Figure 3:
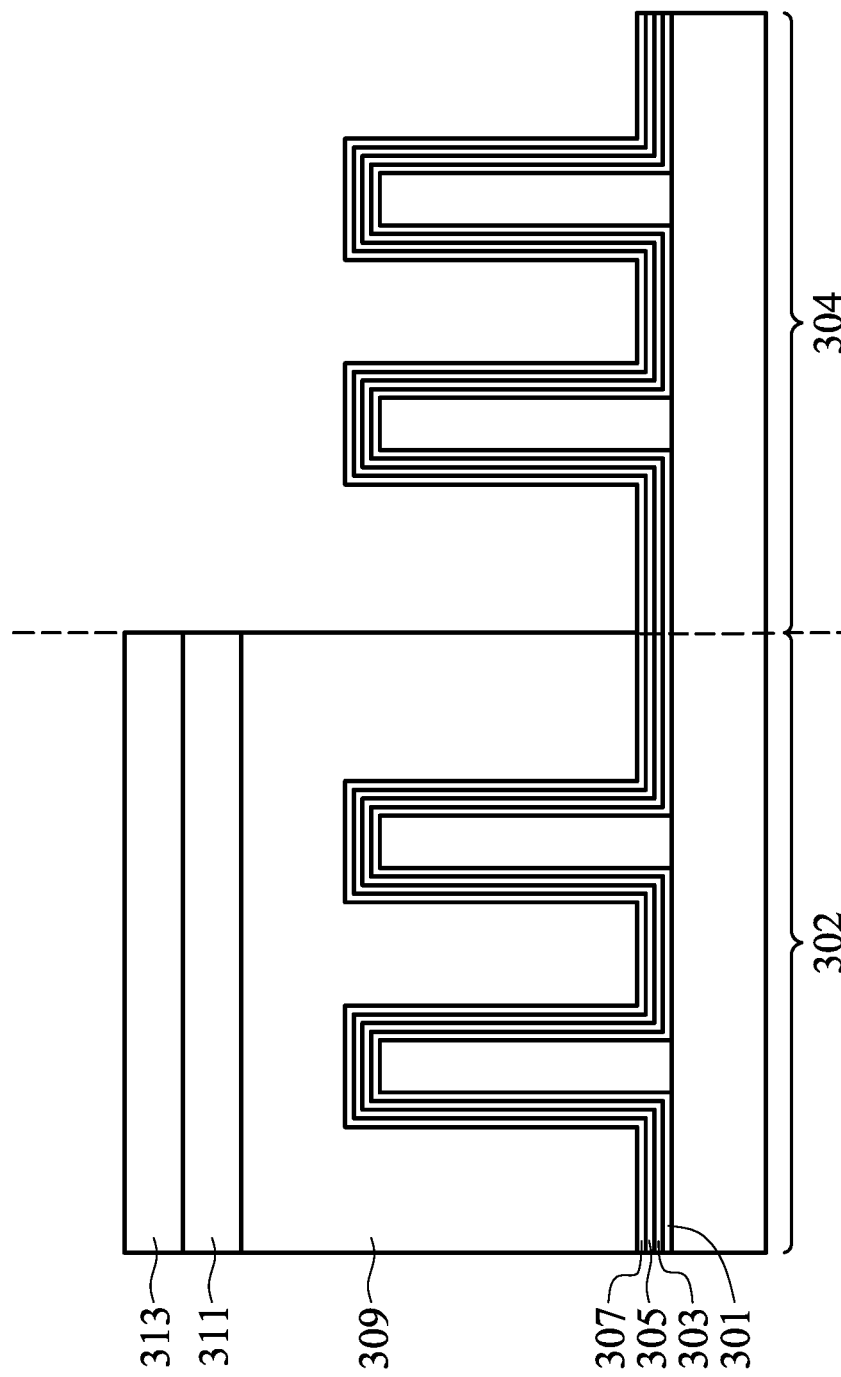
FIG. 3 illustrates formation of a bottom anti-reflective layer and photoresist in accordance with some embodiments.

FIG. 3 illustrates a cross-sectional view of FIG. 2 along line 3-3' in order to better illustrate a removal and replacement of the material of the dummy gate electrode 111 and the dummy gate dielectric 109 with a plurality of layers for a first gate stack 1002 (not illustrated in FIG. 3 but illustrated and described below with respect to FIG. 10). Additionally in FIG. 3, while the first gate stack 1002 is illustrated as being within a first region 302 of the substrate 101, there is also illustrated a second region 304 (for a second gate stack 1004) of the substrate 101, in which the second region 304 may be immediately adjacent to the first region 302 or else may be separated from the first region 302 by a distance (represented in FIG. 3 by the dashed line). In an embodiment the first gate stack 1002 may be a gate stack for a first transistor (e.g., a first NMOS finFET) while the second gate stack 1004 may be for a second transistor (e.g., a first PMOS finFET transistor). However, any suitable devices may be utilized.

In an embodiment the dummy gate electrode 111 and the dummy gate dielectric 109 may be removed using, e.g., one or more wet or dry etching processes that utilize etchants that are selective to the material of the dummy gate electrode 111 and the dummy gate dielectric 109. However, any suitable removal process or processes may be utilized.

Once the dummy gate electrode 111 and the dummy gate dielectric 109 have been removed, a process to form the first gate stack 1002 and the second gate stack 1004 may be begun by depositing a series of layers. In an embodiment the series of layers may include an optional interfacial layer (not separately illustrated), a first dielectric material 301, an optional first n-metal work function layer 303, and a first p-metal work function layer 305.

The optional interfacial layer may be formed prior to the formation of the first dielectric material 301. In an embodiment the interfacial layer may be a material such as silicon dioxide formed through a process such as in situ steam generation (ISSG). In another embodiment the interfacial layer may be a high-k material such as HfO$_2$, HfSiO, HfSiON, HfTaO, HfTiO, HfZrO, LaO, ZrO, Ta$_2$O$_5$, combinations of these, or the like, to a thickness of between about 5 Å and about 20 Å, such as about 10 Å. However, any suitable material or process of formation may be utilized.

Once the interfacial layer is formed, the first dielectric material 301 may be formed over the interfacial layer. In an embodiment the first dielectric material 301 is a high-k material such as HfO$_2$, HfSiO, HfSiON, HfTaO, HfTiO, HfZrO, LaO, ZrO, Ta$_2$O$_5$, combinations of these, or the like, deposited through a process such as atomic layer deposition, chemical vapor deposition, or the like. The first dielectric material 301 may be deposited to a thickness of between about 5 Å and about 200 Å, such as about 12 Å, although any suitable material and thickness may be utilized.

The first n-metal work function layer 303 may be formed over the first dielectric material 301. In an embodiment, the first n-metal work function layer 303 may be a material such as W, Cu, AlCu, TiAlC, TiAlN, Ti, TiN, Ta, TaN, Co, Ni, Ag, Al, TaAl, TaAlC, TaC, TaCN, TaSiN, Mn, Zr, other suitable n-type work function materials, or combinations thereof. For example, the first n-metal work function layer 303 may be deposited utilizing an atomic layer deposition (ALD) process, CVD process, or the like, to a thickness of between about 5 Å and about 5000 Å, such as about 30 Å. However, any suitable materials and processes may be utilized to form the first n-metal work function layer 303.

The first p-metal work function layer 305 may be formed over the first n-metal work function layer 303 (if present) or over the first dielectric material 301 (if the first n-metal work function layer 303 is not present). In an embodiment, the first p-metal work function layer 305 may be formed from a metallic material such as LaO, TiN, Ti, TiAlN, TaC, TaCN, TaSiN, TaSi$_2$, NiSi$_2$, Mn, Zr, ZrSi$_2$, TaN, Ru, Al, Mo, MoSi$_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first p-metal work function layer 305 may be deposited using a deposition process such as atomic layer deposition, chemical vapor deposition, sputtering, or the like, to a thickness of between about 0.8 Å and about 10 Å, such as about 1.2 Å, although any suitable deposition process or thickness may be used.

FIG. 3 additionally illustrates formation of a hard mask layer 307 and a placement and patterning of a bottom anti-reflective layer 309 over the first region 302. In an embodiment the hard mask layer 307 may be a masking material such as aluminum oxide, although any suitable masking material, such as titanium nitride (TiN), tungsten carbide (WC), and silicon (Si), combinations of these, or the like, may also be utilized. The hard mask layer 307 may be formed using a deposition process such as atomic layer deposition, chemical vapor deposition, sputtering, or the like, to a thickness of between about 5 Å and about 100 Å, such as about 20 Å. However, any suitable material, process of formation, and thicknesses may be utilized.

In an embodiment the bottom anti-reflective layer 309 has different optical properties than a subsequently placed photoresist 313 that works to prevent the uncontrolled and undesired reflection of energy (e.g., light) back into the overlying photoresist 313 during an exposure of the photoresist 313, thereby preventing the reflected light from causing reactions in an undesired region of the photoresist 313. For example, the bottom anti-reflective layer 309 may have a different refractive index (n), a different extinction coefficient (k), or a different thickness (T) value than the photoresist 313. Additionally, the bottom anti-reflective layer 309 may be used to provide a planar surface, helping to reduce the negative effects of the energy impinging at an angle.

In an embodiment the material used to form the bottom anti-reflective layer 309 comprises a polymer resin, a catalyst, and a cross-linking agent, all of which are placed into a BARC solvent for dispersal. The polymer resin may comprise a polymer with various monomers bonded together through the cross-linking agent along with a chromophore group. In a particular embodiment the cross-linking monomer may comprise a hydrocarbon chain that also comprises, e.g., a hydroxyl group, a carboxyl acid group, a carboxylic ester group, epoxy groups, urethane groups, amide groups, combinations of these, and the like. Additionally, the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, a polyether polyol, a polyglycidil ether, a vinyl ether, a triazine, combinations of these, or the like. However, any suitable monomers, polymers, and cross-linking agents may be utilized.

The material for the bottom anti-reflective layer 309 may be applied so that the material for the bottom anti-reflective layer 309 coats an upper exposed surface, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the bottom anti-reflective layer 309 may be initially applied such that it has a thickness of between about 10 nm and about 1000 nm, such as about 100 nm. Once in place, the material of the bottom anti-reflective layer 309 may be baked in order to drive off the BARC solvent as well as react the cross-linking agents to cross-link the polymers with each other to form the bottom anti-reflective layer 309.

After the bottom anti-reflective layer 309 has been placed, the material of the bottom anti-reflective layer 309 may have physical properties that may allow certain defects to occur in further processing. For example, in some embodiments the bottom anti-reflective layer 309 as deposited may have a diffusibility (e.g., the rate at which a chemical can diffuse through the material of the anti-reflective layer 309) that allows, after a certain time of exposure, materials of subsequently applied chemicals such as a first wet etchant 601 (described further below with respect to FIG. 6) to diffuse through the bottom anti-reflective layer 309 and react with underlying layers.

FIG. 3 additionally illustrates a patterning of the bottom anti-reflective layer 309 using a middle layer 311 and the photoresist 313. In an embodiment the middle layer 311 may be an organic layer or inorganic layer that has a different etch resistance than the photoresist 313. In a particular embodiment the middle layer 311 is a hard mask material such as a low temperature oxide, aluminum oxide, silicon, silicon nitride, other oxides, oxynitrides, silicon carbide, combinations of these, or the like. The hard mask material for the middle layer 311 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the material of the middle layer 311 may be utilized, and all such methods or combinations are fully intended to be included within the scope of the embodiments. The middle layer 311 may be formed to a thickness of between about 100 Å and about 800 Å, such as about 300 Å.

The photoresist 313 is placed over the middle layer 311 in order to provide a patterned mask so that the middle layer 311 can be patterned into the desired pattern. In an embodiment the photoresist 313 is a photosensitive material that is dispersed onto the middle layer 311 and then exposed to a patterned energy source (e.g., light) in order to induce a chemical reaction in those portions of the photosensitive material that are exposed. This chemical reaction causes a change in physical properties which may be utilized in a development process to separate the exposed portion of the photosensitive material from the unexposed portion of the photosensitive material to create a patterned photoresist.

Once the photoresist 313 has been patterned into the desired pattern, the photoresist 313 may be used as a mask to pattern the material of the middle layer 311. For example, the pattern of the photoresist 313 may be transferred to the middle layer 311 using an anisotropic etching process such as reactive ion etching (RIE), whereby ions of a suitable etchant such as $CF_4$—$O_2$, may be utilized in a dry etch to remove portions of the middle layer 311 exposed by the patterned photoresist 313. However, any other suitable etchant, such as $CHF_3/O_2$, $CH_2F_2$, $CH_3F$, or the like, and any other suitable method of removal, such as a wet stripping, may alternatively be used.

Once the pattern of the photoresist 313 has been transferred to the middle layer 311, the middle layer 311 may be used to transfer the pattern of the photoresist 313 to the bottom anti-reflective layer 309 to expose the hard mask layer 307 in the second region 304. In an embodiment the bottom anti-reflective layer 309 may be etched using an etching process that utilizes the photoresist 313 and the middle layer 311 (now patterned) as a masking layer. The etching process may be a dry etch process utilizing an etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, trifluoromethane, tetrafluoromethane, perfluorocyclobutane, perfluoropropane, combinations of these, or the like. However, any other suitable etch process, such as a wet etch, or even a wet etch performed simultaneously with the middle layer 311, and any other suitable etchants may be used.

Figure 4:
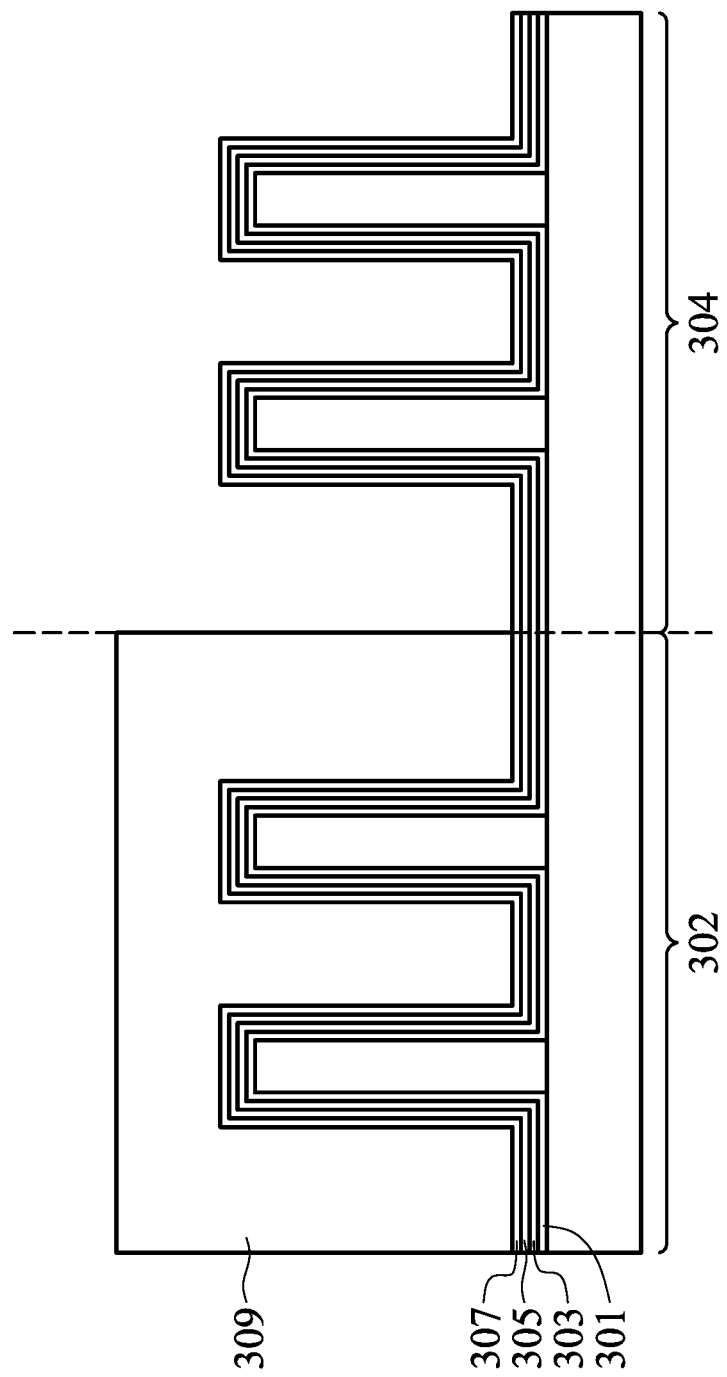
FIG. 4 illustrates a removal of the photoresist in accordance with some embodiments.

FIG. 4 illustrates that, once the bottom anti-reflective layer 309 has been patterned, the photoresist 313 and the middle layer 311 may be removed. In an embodiment the photoresist 313 may be removed using, for example, an ashing process, whereby the temperature of the photoresist 313 is increased to a point where the photoresist 313 undergoes a thermal decomposition, after which the decomposed photoresist 313 may be easily removed.

Once the photoresist 313 has been removed, the middle layer 311 may be removed. In an embodiment the middle layer 311 may be removed using one or more etching processes, such as a wet etching or dry etching process. However, any suitable removal process may be utilized.

Figure 5:
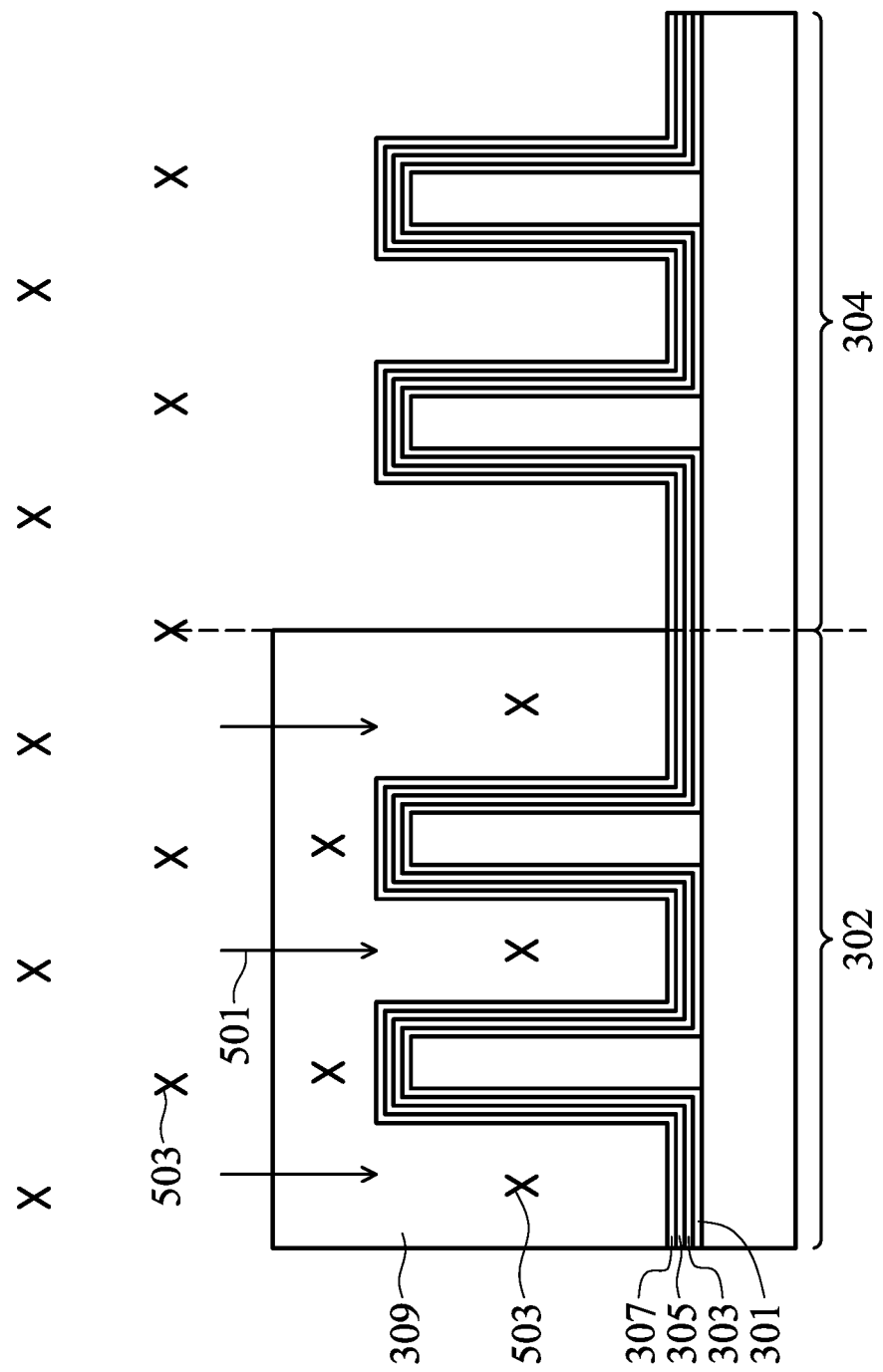
FIG. 5 illustrates a treatment of the bottom anti-reflective layer, in accordance with some embodiments.

FIG. 5 illustrates a treatment process (represented in FIG. 5 by the arrows labeled 501) which may be utilized in order to treat and protect the bottom anti-reflective layer 309, reduce the diffusibility of etchants through the bottom anti-reflective layer 309, and help prevent undesired and unwanted penetration of subsequent chemicals through the bottom anti-reflective layer 309. In the embodiment illustrated in FIG. 5, the treatment is a non-reacting, physical treatment which does not chemically modify the structure of the bottom anti-reflective layer 309 (other embodiments are discussed further below with respect to FIGS. 11-13). In a particular embodiment, the treatment process 501 may be a filling treatment which fills up the pores (through, e.g., capillary forces) and other openings of the bottom anti-reflective layer 309, thereby preventing subsequently applied chemicals from entering those pores and other openings as the subsequently applied chemicals attempt to make their way through the bottom anti-reflective layer 309.

In such an embodiment the treatment process 501 may be performed by applying a first treatment chemical (represented in FIG. 5 by the "X"s labeled 503). In an embodiment the first treatment chemical 503 may be a chemical with physical properties that allow it to enter within the pores of the bottom anti-reflective layer 309. For example, in some embodiments the first treatment chemical 503 may have a viscosity of less than about 5 cp, such as between about 1 cp and about 3 cp, and may also have a surface tension of less than about 40 mN/m, such as between about 10 mN/m and about 30 mN/m. Additionally, the first treatment chemical 503 may have a specific gravity of between about 0.7 and about 2, such as about 0.79. Finally, the first treatment chemical 503 may have a water solubility of between about $10^{-1}$ g/mL and about $10^{-4}$ g/mL, and will not chemically react with subsequently applied chemicals.

In a particular embodiment, the first treatment chemical 503 may be a hydrocarbon such as isopropyl alcohol (IPA), hexane, acetone, benzene, combinations of these, or the like. However, any other suitable chemical, such as other n-alkanes, other hydrocarbon alkanes, or the like, may also be utilized. Any suitable chemical which can inhibit the movement of subsequently applied chemicals through the bottom anti-reflective layer 309 may be utilized, and all such chemicals are fully intended to be included within the scope of the embodiments.

The treatment process 501 may be initiated by placing the first treatment chemical 503 into physical contact with the bottom anti-reflective layer 309. In an embodiment the first treatment chemical 503 may be applied using a process such as a spin-on coating process, a dip coating method, an air-knife coating method, a curtain coating method, a wire-bar coating method, a gravure coating method, a lamination method, an extrusion coating method, combinations of these, or the like. However, any suitable method of applying the first treatment chemical 503 may be utilized.

The first treatment chemical 503 may be applied at a temperature of between about 5° C. and about 80° C., such as about 25° C. Additionally, the treatment process 501 may be continued to such a time that is sufficient to fill up the pores and openings of the bottom anti-reflective layer 309, such as for a time period of between about 30 seconds and about 240 seconds, such as about 120 seconds. However, any suitable time and temperature may be utilized.

During the treatment process 501 the first treatment chemical 503 will enter into the pores and other openings located within the bottom anti-reflective layer 309 and soak the bottom anti-reflective layer 309 through the use of capillary forces. By filling these pores and other openings and remaining within these pores and other openings, the first treatment chemical 503 will slow down, or even completely prevent, the movement of subsequently applied chemicals through the bottom anti-reflective layer 309 (discussed further below). By slowing down the movement of subsequent chemicals, the subsequently applied chemicals will be unable to reach the underlying hard mask layer 307. Additionally, by preventing the subsequently applied chemicals from reaching the underlying hard mask layer 307, the subsequently applied chemicals will be unable to react with the underlying hard mask layer 307 and is prevented from causing defects such as bubbling from occurring. Such prevention allows for an increase the available clean times and a broadening of the wet clean window for smaller process nodes (e.g., N5, N3, etc.) and smaller fin-to-fin pitches.

Figure 6:
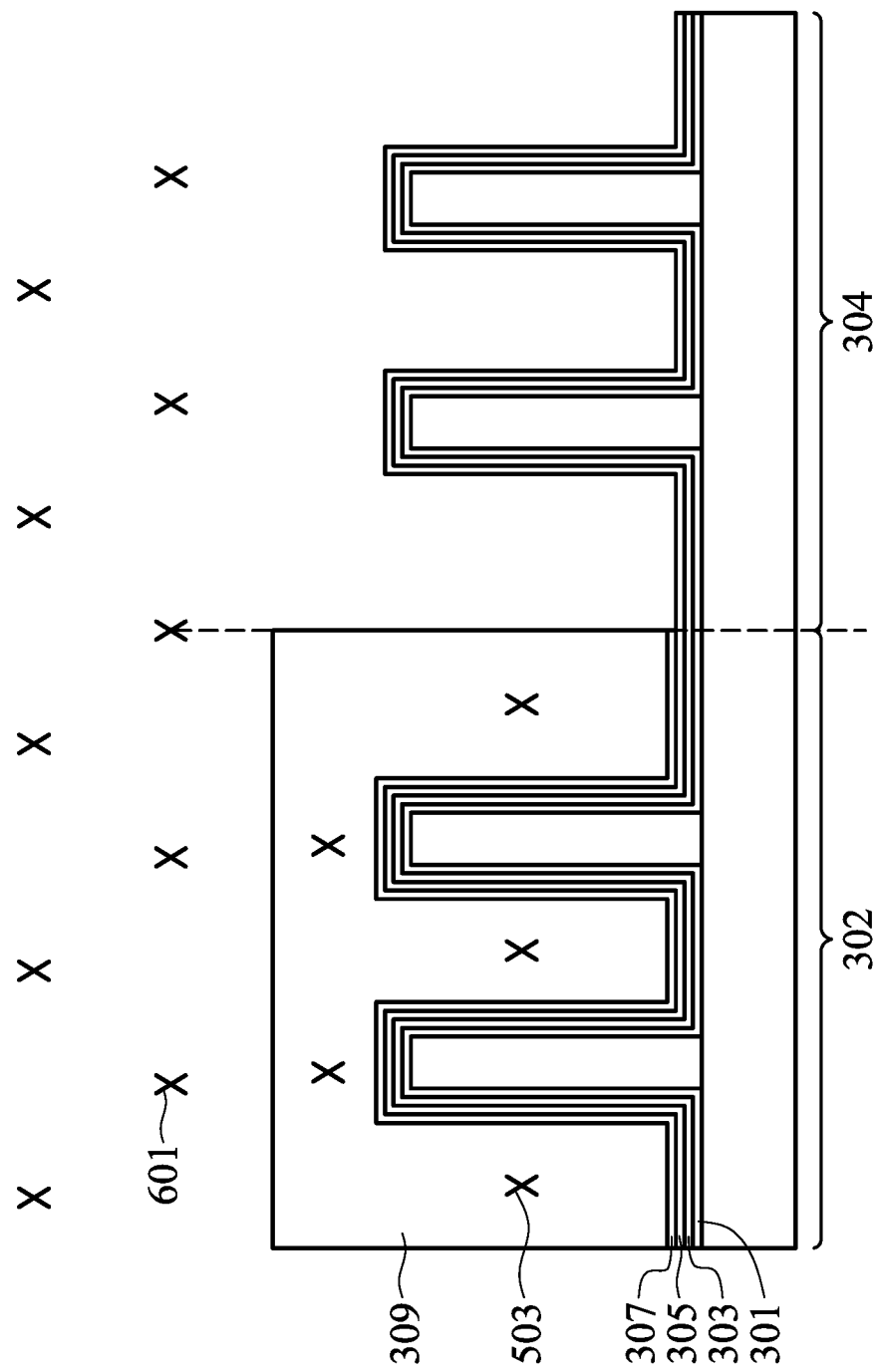
FIG. 6 illustrates a first removal process, in accordance with some embodiments.

FIG. 6 illustrates a removal of the hard mask layer 307 from the second region 304. In an embodiment the hard mask layer 307 may be removed using a wet etching process with a wet etchant (represented in FIG. 6 by the Xs labeled 601) that is selective to the removal of the material chosen for the hard mask layer 307 (e.g., aluminum oxide). As such, in an embodiment in which the hard mask layer 307 is aluminum oxide, the removal of the hard mask layer 307 may be performed with a first wet etchant 601 such as ammonium hydroxide ($NH_4OH$), phosphoric acid ($H_3PO_4$), hydrogen peroxide, combinations of these, or the like.

In a particular embodiment, the hard mask layer 307 may be removed using a diluted ammonium hydroxide solution. For example, the wet etching solution may comprise ammonium hydroxide and water at a ratio of 1:20. In another embodiment, the hard mask layer 307 may be removed using a mixture of ammonium hydroxide and hydrogen peroxide put into a solvent such as water. For example, the wet etching solution may comprise 29% ammonium hydroxide and 31% hydrogen peroxide, with the rest of the solution comprising water. However, any suitable etchant and etching solutions may be utilized.

In an embodiment the wet etching process may be performed at a temperature sufficient to react the first wet etchant 601 with the material of the hard mask layer 307, such as a temperature of between about 5° C. and about 70° C., such as about 25° C. Additionally, the wet etching process may be performed for a time period of between about 20 seconds and about 300 seconds, such as about 144 seconds. However, any suitable time and temperature may be utilized.

However, with the presence of the first treatment chemical 503 still within the pores and openings of the bottom anti-reflective layer 309, the diffusibility (e.g., the speed of diffusion through the bottom anti-reflective layer 309) of the first wet etchant 601 may be reduced and, as such, any diffusion of the first wet etchant 601 into and/or through the bottom anti-reflective layer 309 is reduced or even eliminated. As such, as long as the wet etching process is performed less than a time period that allows the first wet etchant 601 to penetrate through the bottom anti-reflective layer 309, the first wet etchant 601 will not penetrate through the bottom anti-reflective layer 309, thereby preventing any reaction between the hard mask layer 307 and the first wet etchant 601. As such, defects arising from such a reaction (e.g., bubble defects or blister defects which are difficult to remove by ashing processes and which can lead to wafer acceptance test failures for threshold voltage breakdown voltage, work function off-target failures, etc.) can be avoided.

Figure 7:
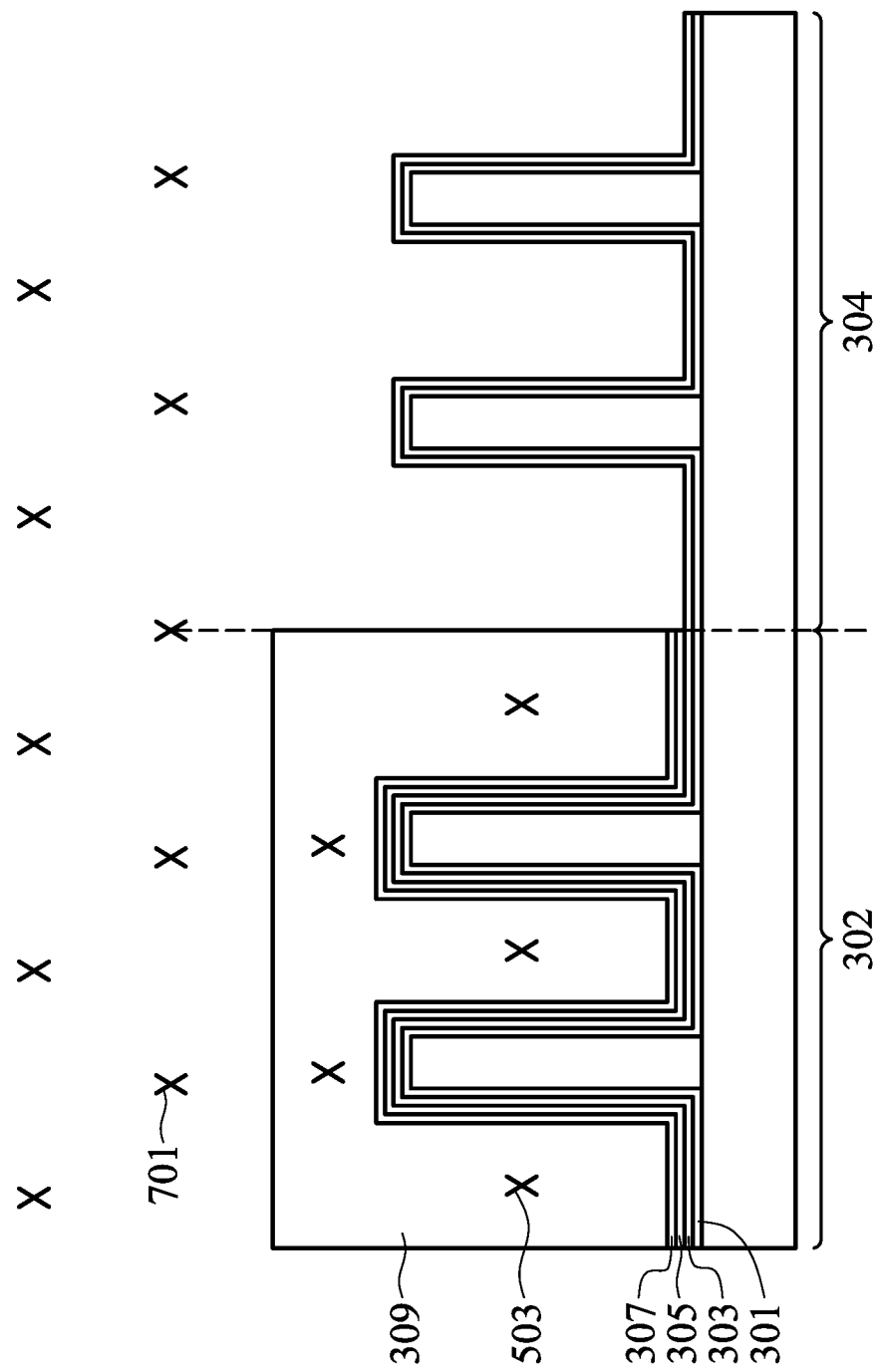
FIG. 7 illustrates a second removal process, in accordance with some embodiments.

FIG. 7 illustrates a removal of the first p-metal work function layer 305 from the second region 304. In an embodiment the first p-metal work function layer 305 may be removed using one or more etching process, such as a wet etching process or a dry etching process that is selective to the material of the first p-metal work function layer 305 (e.g., lanthanum oxide). However, any suitable removal process may be utilized.

In an embodiment the first p-metal work function layer 305 may be removed using a wet etching process with a second wet etchant (represented in FIG. 7 by the Xs labeled 701) that is selective to the removal of the material chosen for the first p-metal work function layer 305 (e.g., lanthanum oxide). As such, in an embodiment in which the first p-metal work function layer 305 is lanthanum oxide, the removal of the first p-metal work function layer 305 may be performed with a second wet etchant 701 such as hydrochloric acid, phosphoric acid, hydrogen peroxide, combinations of these, or the like.

In a particular embodiment, the first p-metal work function layer 305 may be removed using a mixture of hydrochloric acid and water. For example, in this embodiment the mixture may comprise hydrochloric acid and water at a ratio of 1:25. In another embodiment the first p-metal work function layer 305 may be removed using a mixture of hydrochloric acid and hydrogen peroxide put into a solvent such as water. In this embodiment, the second wet etchant 701 may comprise 37% hydrochloric acid and 31% hydrogen peroxide, with the rest of the solution comprising water. However, any suitable etchant may be utilized.

In an embodiment the wet etching process to remove the first p-metal work function layer 305 may be performed at a temperature sufficient to react the second wet etchant 701 with the material of the first p-metal work function layer 305, such as a temperature of between about 5° C. and about 70° C., such as about 50° C. Additionally, the wet etching process may be performed for a time period of between about 20 seconds and about 280 seconds, such as about 154 seconds. However, any suitable time and temperature may be utilized.

However, with the presence of the first treatment chemical 503 still within the pores of the bottom anti-reflective layer 309, any diffusion of the second wet etchant 701 into and/or through the bottom anti-reflective layer 309 is reduced or eliminated. As such, as long as the wet etching process is performed less than a time period that allows the second wet etchant 701 to penetrate through the bottom anti-reflective layer 309, the second wet etchant 701 will not penetrate through the bottom anti-reflective layer 309, thereby preventing any reaction between the hard mask layer 307 and the second wet etchant 701. As such, defects arising from such a reaction (e.g., bubble defects or blister defects) can be avoided.

For example, without the presence of the first treatment chemical 503 within the pores of the bottom anti-reflective layer 309, the second wet etchants 701 (with, e.g., hydrochloric acid in it), may reach the surface of the hard mask layer 307 (e.g., aluminum oxide). If the second wet etchants 701 do reach the surface, the reactions represented by Equations 1 and 2 may occur.

$$Al_2O_3 + 3H_2O \rightarrow 2Al(OH)_3 \qquad \text{Eq. 1}$$

$$Al(OH)_3 + 3HCl \rightarrow AlCl_3 + 3H_2O \qquad \text{Eq. 2}$$

Further, because AlCl3 is water soluble, it will work to uplift the overlying bottom anti-reflective layer 309 and cause a blister. However, with the presence of the first treatment chemical 503, these reactions can be prevented by preventing the second wet etchants 701 from reaching the hard mask layer 307.

For example, in an embodiment in which the second wet etchant 701 is applied for 210 seconds and the treatment process 501 is applied for 60 seconds, the number of defects can be reduced from 182 bubble defects (for a device that did not use the treatment process 501) to 154 defects. Additionally, in embodiments in which the second wet etchant 701 is applied for 154 seconds and the treatment process 501 is applied for either 30 seconds or 60 seconds, the number of defects can be reduced from 216 bubble defects (for a device that did not use the treatment process 501) to 2 defects (at 30 seconds of the treatment process 501) and even no defects (at 60 seconds of the treatment process 501).

Once the first p-metal work function layer 305 has been removed the structure may be cleaned and then the bottom anti-reflective layer 309 may be removed. In an embodiment the structure may be cleaned by applying the first wet etchant 601 for a short time period of between about 5 seconds and about 120 seconds, such as about 10 seconds, and then rinsing the structure with a rinse liquid of, e.g., deionized water for a time period of between about 10 seconds and about 120 seconds, such as about 30 seconds. However, any suitable cleaning processes may be utilized at this stage as well.

Additionally, while the above description puts forth a process whereby the treatment process 501 is performed prior to the removal of the hard mask layer 307, this is intended to be illustrative and is not intended to be limiting to the embodiments. Rather, the bottom anti-reflective layer 309 may be treated at any point in the process which helps to prevent the unwanted diffusion of bulk chemicals through the bottom anti-reflective layer 309. For example, in some embodiments, the middle layer 311 and the hard mask layer 307 may comprise the same material (e.g., aluminum oxide), and it would be beneficial to pattern the hard mask layer 307 in the same process step as the removal of the middle layer 311. In such an embodiment, because the middle layer 311 is still present to protect the bottom anti-reflective coating at the beginning, the treatment process 501 may not occur until after the patterning of the hard mask layer 307 and before the patterning of the first p-metal work function layer 305. Any suitable placement of the treatment process 501 into the process may be utilized, and all such placements are fully intended to be included within the scope of the embodiments.

Also, while certain chemical etchants have been described herein to discuss the removal and/or patterning of the hard mask layer 307 and the first p-metal work function layer 305, the process of treatment the bottom anti-reflective layer 309 to avoid the formation of blisters is not intended to be limited to the bulk chemicals described above. Rather, the treatment process may be used to protect underlying layers for a wide variety of bulk chemicals that may be used to remove and/or pattern a wide variety of materials during the manufacture of semiconductor devices. For example, bulk chemicals such as sulfuric acid ($H_2SO_4$), phosphoric acid ($H_3PO_4$), hydrochloric acid, hydrogen fluoride (HF), ammonium hydroxide, hydrogen peroxide ($H_2O_2$), ammonium fluoride, ozone, combinations of these, and the like are used to form a wide variety of etchants and etching solutions. Processes which utilize these bulk chemicals may all see a benefit from utilizing the ideas expressed herein, and all such uses are fully intended to be included within the scope of the embodiments.

Figure 8:
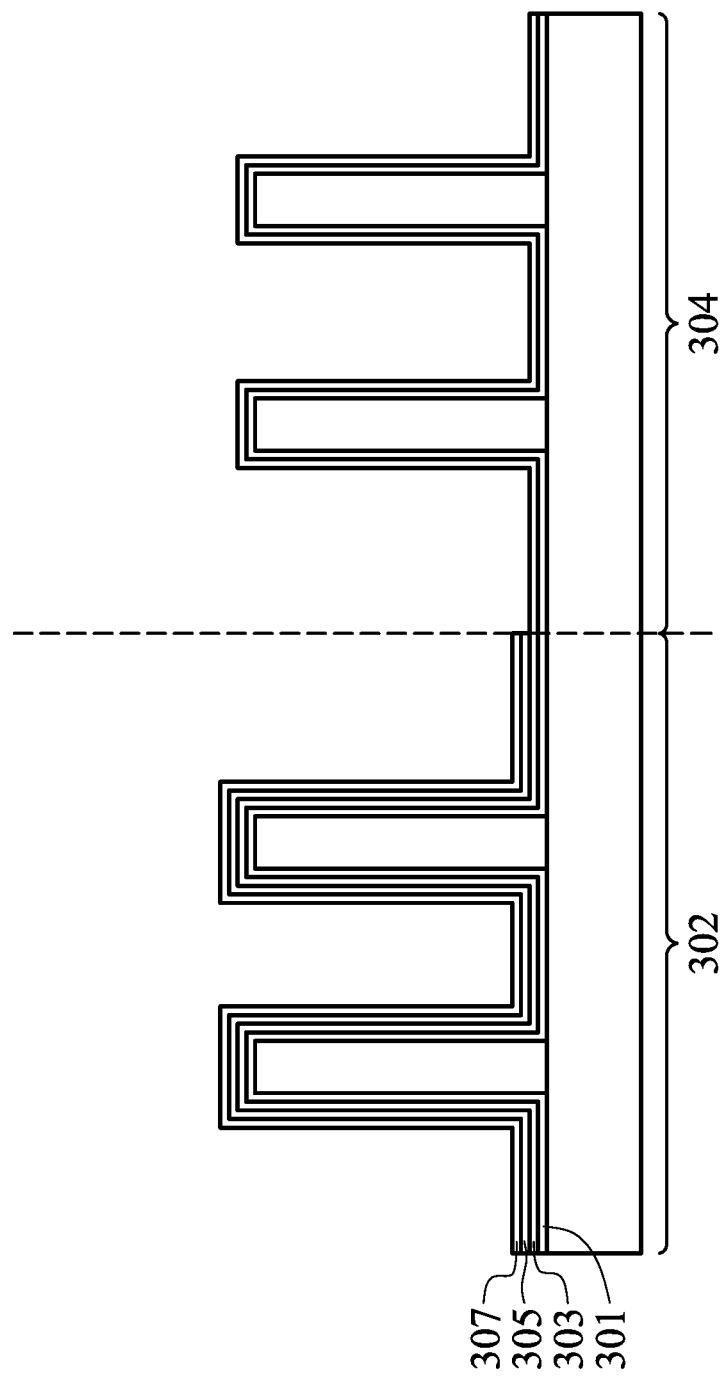
FIG. 8 illustrates a removal of the bottom anti-reflective layer, in accordance with some embodiments.

FIG. 8 illustrates that once the structure has been cleaned, the bottom anti-reflective layer 309 may be removed. In an embodiment the bottom anti-reflective layer 309 may be removed using an etching process or an ashing process. In an embodiment in which the bottom anti-reflective layer 309 is removed in an ashing process, a temperature of the bottom anti-reflective layer 309 is increased until the bottom anti-reflective layer 309 experiences a thermal decomposition and can then be removed. However, any other suitable process may be utilized in order to remove the bottom anti-reflective layer 309.

Figure 9:
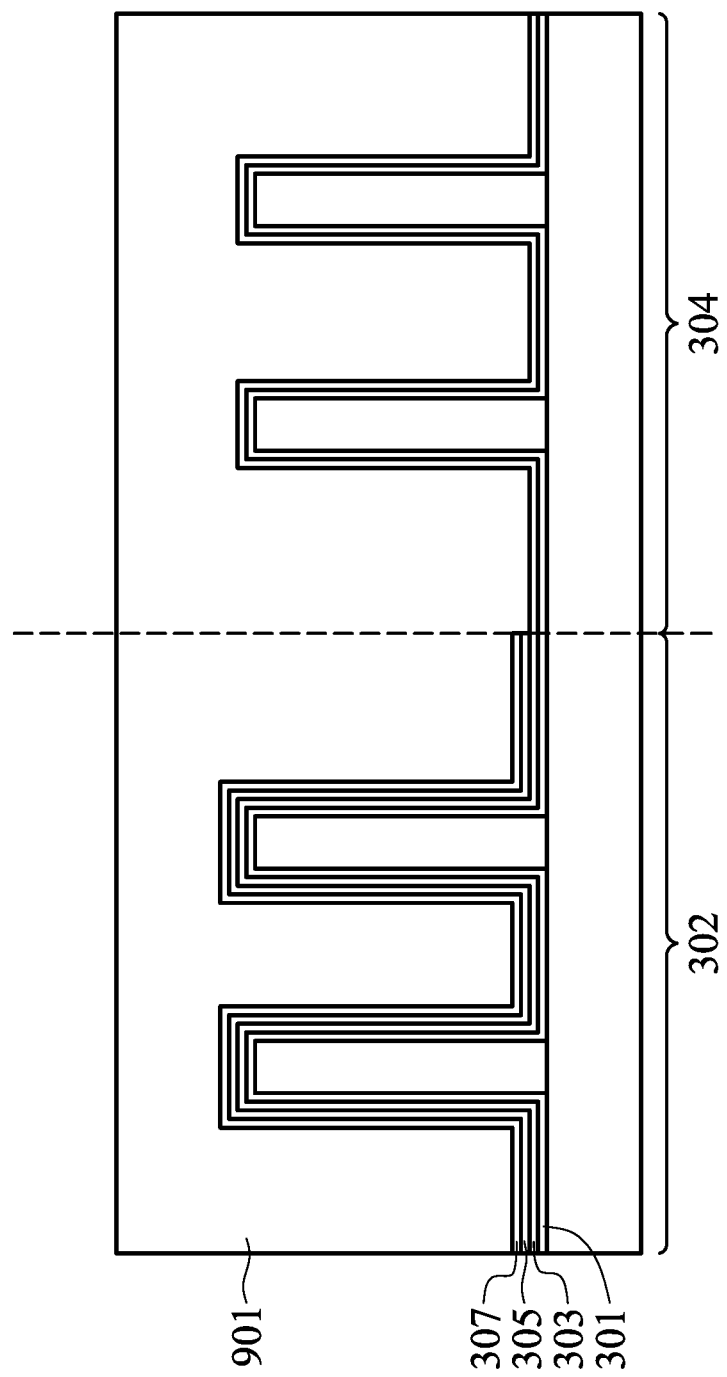
FIG. 9 illustrates a formation of a fill material, in accordance with some embodiments.

FIG. 9 illustrates that once the bottom anti-reflective layer 309 has been removed, a glue layer (not separately illustrated) and a fill material 901 may be formed. In an embodiment the glue layer may be formed in order to help adhere the overlying fill material 901 with the underlying materials as well as provide a nucleation layer for the formation of the fill material 901. In an embodiment the glue layer may be a material such as titanium nitride and may be formed using a similar process such as ALD to a thickness of between about 10 Å and about 100 Å, such as about 50 Å. However, any suitable materials and processes may be utilized.

Once the glue layer has been formed, the fill material 901 is deposited to fill a remainder of the opening using the glue layer. In an embodiment the fill material 901 may be a material such as tungsten, Al, Cu, AlCu, Ti, TiAlN, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. Additionally, the fill material 901 may be deposited to a thickness of between about 1000 Å and about 2000 Å, such as about 1500 Å. However, any suitable material may be utilized.

Figure 10:
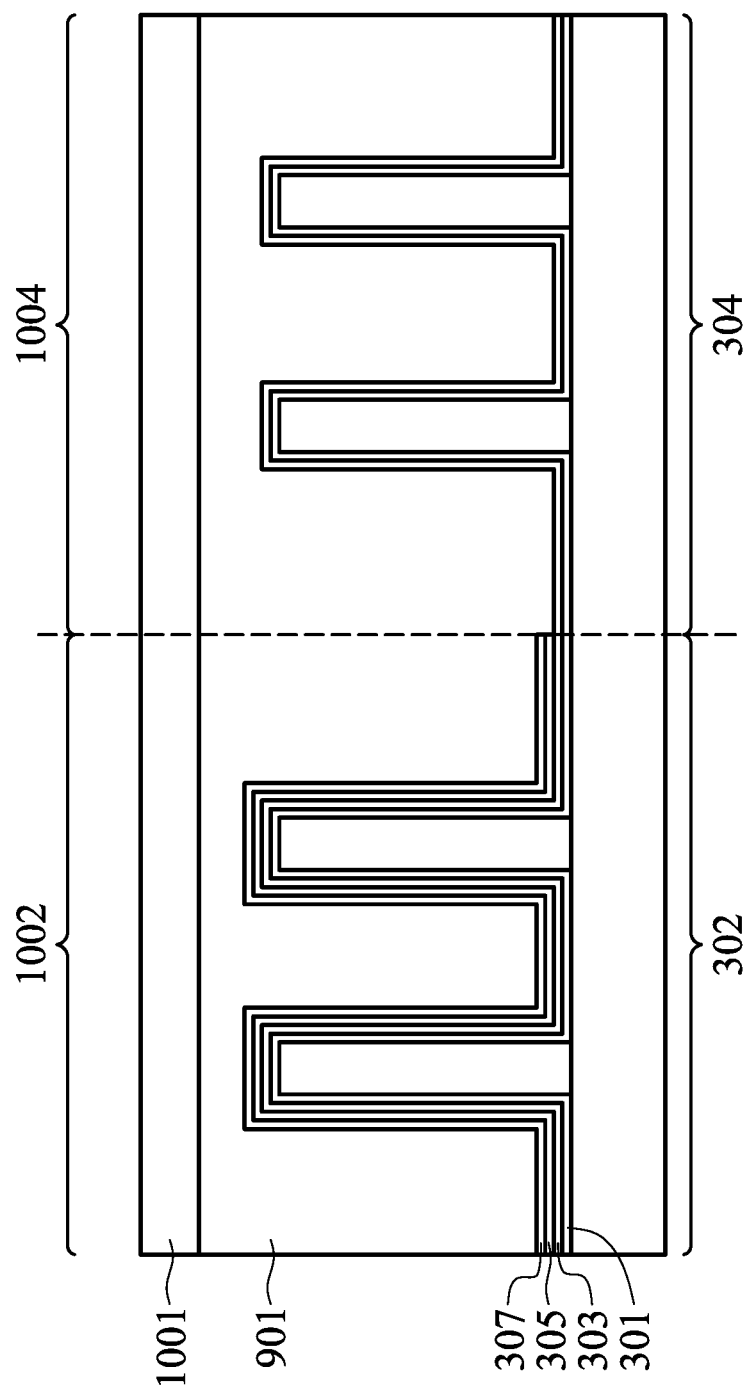
FIG. 10 illustrates a formation of a cap, in accordance with some embodiments.

FIG. 10 illustrates that, after the fill material 901 has been deposited to fill and overfill the opening, the materials within each of the openings of the first region 302 and the second region 304 may be planarized to form a first gate stack 1002 and a second gate stack 1004. In an embodiment the materials may be planarized with the first spacers 113 (see FIG. 1) using, e.g., a chemical mechanical polishing process, although any suitable process, such as grinding or etching, may be utilized.

After the materials of the first gate stack 1002 and the second gate stack 1004 have been formed and planarized, the materials of the first gate stack 1002 and the second gate stack 1004 may be recessed and capped with a capping layer 1001. In an embodiment the materials of the first gate stack 1002 and the second gate stack 1004 may be recessed using, e.g., a wet or dry etching process that utilizes etchants selective to the materials of the first gate stack 1002 and the second gate stack 1004. In an embodiment the materials of the first gate stack 1002 and the second gate stack 1004 may be recessed a distance of between about 5 nm and about 150 nm, such as about 120 nm. However, any suitable process and distance may be utilized.

Once the materials of the first gate stack 1002 and the second gate stack 1004 have been recessed, the capping layer 1001 may be deposited and planarized with the first spacers 113. In an embodiment the capping layer 1001 is a material such as SiN, SiON, SiCON, SiC, SiOC, combinations of these, or the like, deposited using a deposition process such as atomic layer deposition, chemical vapor deposition, sputtering, or the like. The capping layer 1001 may be deposited to a thickness of between about 5 Å and about 200 Å, and then planarized using a planarization process such as chemical mechanical polishing such that the capping layer 1001 is planar with the first spacers 113.

Figure 11:
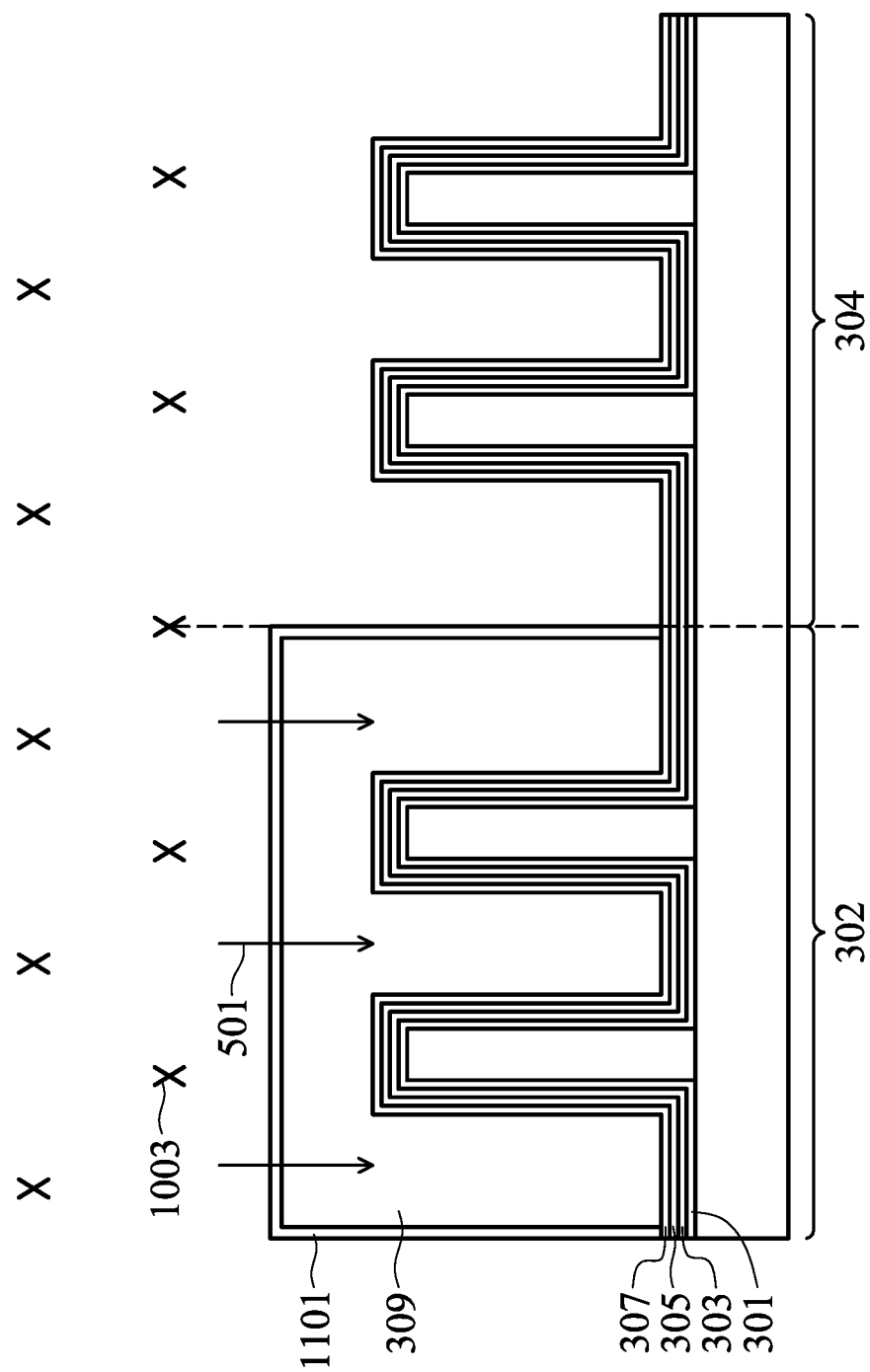
FIG. 11 illustrates a formation of a protective layer, in accordance with some embodiments.

FIG. 11 illustrates another embodiment in which the treatment process 501, instead of simply filling up pores in order to block diffusion, actually forms a protective layer 1101 by reacting a portion of the bottom anti-reflective layer 309 with a first reactant (represented in FIG. 11 by the Xs labeled 1103). In an embodiment the protective layer 1101 may be formed by introducing the first reactant 1103 to the bottom anti-reflective layer 309.

In an embodiment the first reactant 1103 may be an organic reactant that is suitable to react with the material of the bottom anti-reflective layer 309 and form the protective layer 1101. As such, while the precise reactant used to form the protective layer 1101 is at least in part dependent upon the material chosen for the bottom anti-reflective layer 309, in some embodiments the first reactant 1103 may be a material such as hexamethyldisilazane (HMDS), citric acid, acetic acid, combinations of these, or the like. However, any suitable material may be utilized.

In another particular embodiment the first reactant 1103 may be an organic reactant which is suitable to form a self-aligned monolayer (SAM) along a top surface of the bottom anti-reflective layer 309. In such an embodiment the first reactant 1103 will react with the exposed terminal groups of the bottom anti-reflective layer 309 and form a single layer of the self-aligned monolayer with the outer most terminal groups of the bottom anti-reflective layer 309. In this embodiment the first reactant 1103 may be an organic molecule with an OH or carboxylic acid group such as R—OH, R—COOH, combinations of these, or the like, wherein R represents a carbon chain with any suitable number of carbon atoms. However, any suitable reactant may be utilized.

In an embodiment the first reactant 1103 may be introduced to the bottom anti-reflective layer 309 through a wet process or a dry process, depending upon the desired reactant. For example, in an embodiment in which the first reactant 1103 is HMDS, the first reactant 1103 may be introduced in a liquid form through a process such as a spin-on coating process, a dip coating method, an air-knife coating method, a curtain coating method, a wire-bar coating method, a gravure coating method, a lamination method, an extrusion coating method, combinations of these, or the like. However, any suitable process may be utilized.

Additionally, in an embodiment in which the first reactant 1103 is placed into contact with the bottom anti-reflective layer 309 in a liquid form, the process may be performed at a temperature of between about 5° C. and about 80° C., such as about 25° C. Further, the process may be performed for a time of between about 5 seconds and about 240 seconds, such as about 60 seconds. However, any suitable process conditions may be utilized.

Once the first reactant 1103 has been put into contact with the bottom anti-reflective layer 309, the first reactant 1103 will both diffuse into the bottom anti-reflective layer 309 and also react with the material of the bottom anti-reflective layer 309 to form the protective layer 1101. In a particular embodiment in which the first reactant 1103 is HMDS, the protective layer 1101 may be a reaction product between the first reactant 1103 and the material of the bottom anti-reflective layer 309. However, any suitable material may be formed for the protective layer 1101.

Additionally, the protective layer 1101 may be formed to a depth and a thickness that is sufficient to help reduce or even eliminate diffusion of the subsequently applied chemicals. As such, while the depth may be dependent at least in part on the materials chosen for the bottom anti-reflective layer 309 and the chemicals, in some embodiments the protective layer 1101 may be formed to a thickness of between about 5 Å and about 100 Å, such as about 10 Å. However, any suitable depth and any suitable thickness may be formed.

Figure 12:
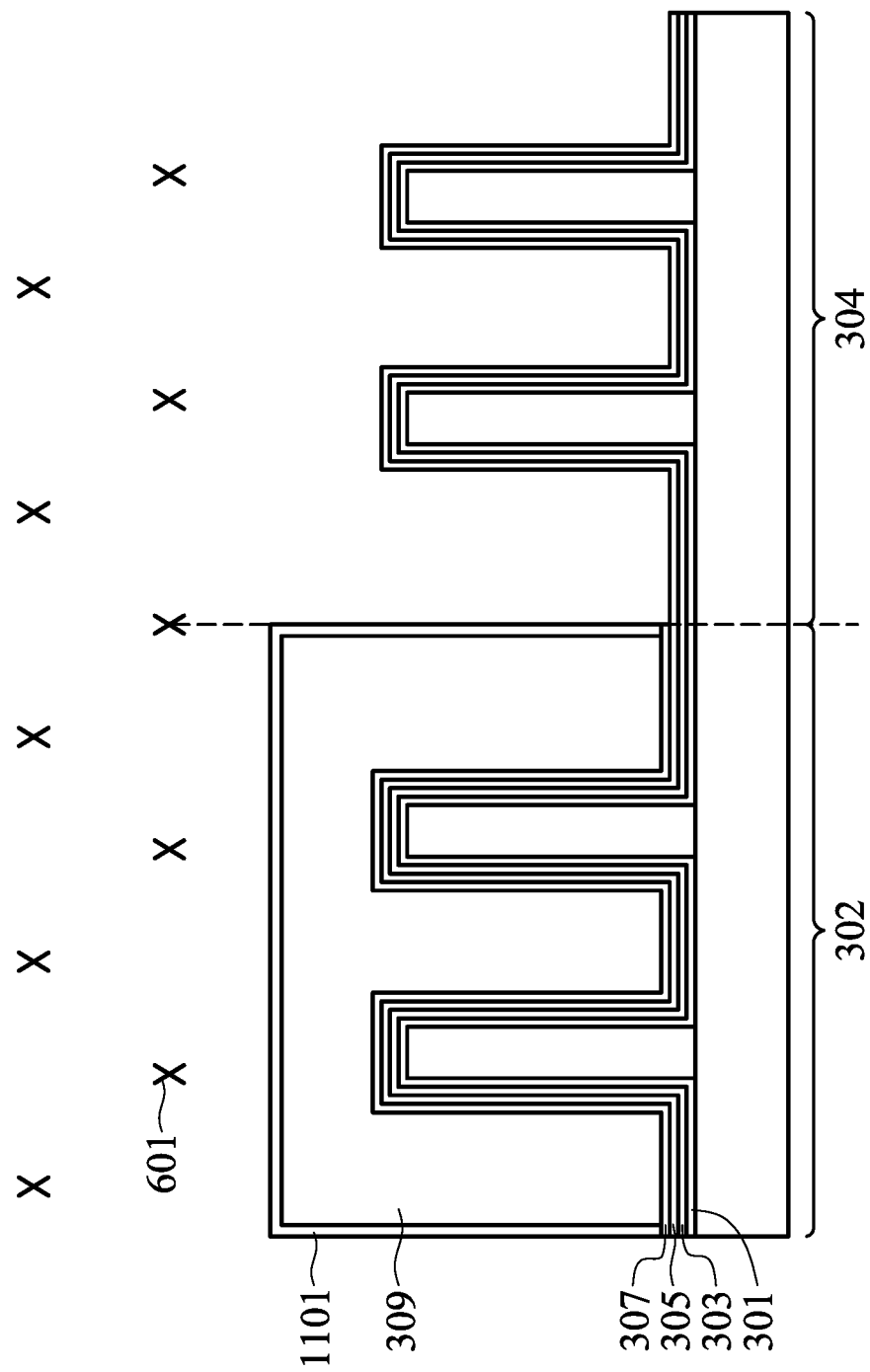
FIG. 12 illustrates a first removal process with the protective layer, in accordance with some embodiments.

FIG. 12 illustrates a removal of the hard mask layer 307 from the second region 304 with the protective layer 1101 in place. In an embodiment the hard mask layer 307 may be removed as described above with respect to FIG. 6 (e.g., using a wet etching process with the first wet etchant 601 such as ammonium hydroxide). However, any suitable removal process may be utilized to remove the hard mask layer 307 from the second region 304.

Additionally, with the protective layer 1101 being present during the removal of the hard mask layer 307, the protective layer 1101 helps to reduce or prevent any diffusion of the first wet etchant 601 into or through the bottom anti-reflective layer 309. As such, there is a reduced possibility that the first wet etchant 601 will make its way through the bottom anti-reflective layer and make physical contact with the underlying layers, and there is a reduced possibility that these chemicals will react with the underlying layers and cause defects.

Figure 13:
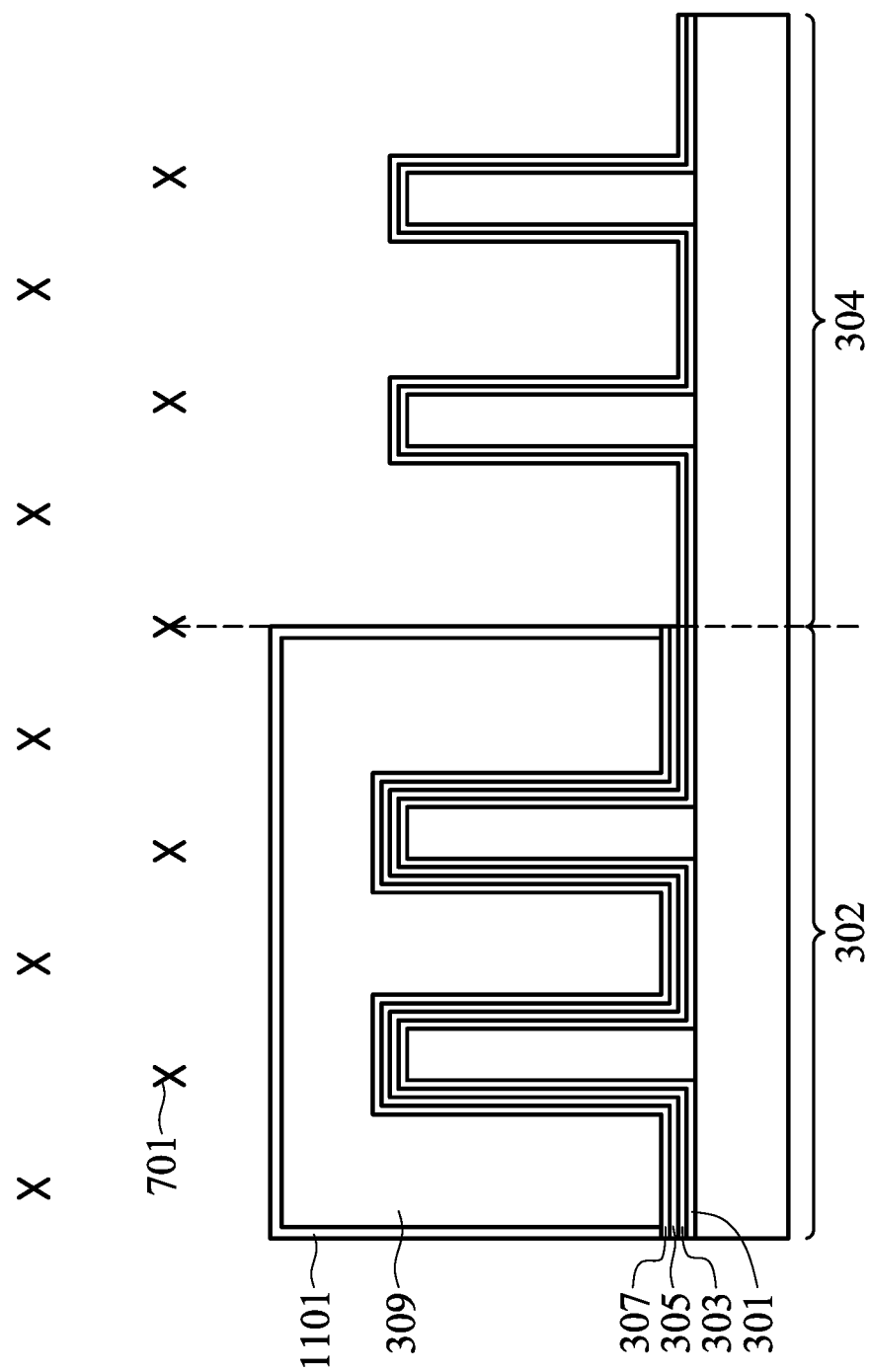
FIG. 13 illustrates a second removal process with the protective layer, in accordance with some embodiments.

FIG. 13 illustrates a removal of the first p-metal work function layer 305 from the second region 304 with the protective layer 1101 in place. In an embodiment the first p-metal work function layer 305 may be removed as described above with respect to FIG. 7 (e.g., using a wet etching process with the second wet etchant 701 such as hydrochloric acid). However, any suitable removal process may be utilized to remove the first p-metal work function layer 305 from the second region 304.

Additionally, with the protective layer 1101 being present during the removal of the first p-metal work function layer 305, the protective layer 1101 helps to reduce or prevent any diffusion of the second wet etchant 701 into or through the bottom anti-reflective layer 309. As such, there is a reduced possibility that the second wet etchant 701 will make its way through the bottom anti-reflective layer and make physical contact with the underlying layers, and there is a reduced possibility that these chemicals will react with the underlying layers and cause defects.

Once the first p-metal work function layer 305 has been removed from the second region 304, further processing may be performed as described above with respect to FIGS. 8-10. For example, the bottom anti-reflective layer 309 (along with the protective layer 1101) may be removed using etching and/or ashing processes, the fill material 901 is deposited, and the capping layer 1001 is formed. However, any suitable processes may subsequently be utilized.

By utilizing the processes described herein, undesired defects may be avoided during the patterning process of the hard mask layer 307 and/or the patterning process of the first p-metal work function layer. In particular, by inhibiting or eliminating movement of the etching chemicals through the bottom anti-reflective layer 309, these chemicals will be unable to react with the underlying layers and caused blisters to occur. As such, without the presence of the blisters, overall damage may be reduced, especially as the size of devices is reduced to smaller and smaller process nodes.

In an embodiment a method of manufacturing a semiconductor device, the method includes: forming a first layer over a raised semiconductor region; applying a bottom anti-reflective layer over the first layer, the bottom anti-reflective layer having a first diffusibility with respect to a first chemical; patterning the bottom anti-reflective layer; reducing the first diffusibility to a second diffusibility with respect to the first chemical; and removing a portion of the first layer using the first chemical while the bottom anti-reflective layer is present. In an embodiment, the reducing the first diffusibility is done at least in part with a physical process. In an embodiment, the physical process fills pores of the bottom anti-reflective layer with a second chemical. In an embodiment, the second chemical comprises isopropyl alcohol. In an embodiment, the reducing the first diffusibility is done at least in part with a chemical process. In an embodiment, the chemical process reacts a portion of the bottom anti-reflective layer with a first reactant. In an embodiment, the first reactant is hexamethyldisilazane.

In another embodiment, a method of manufacturing a semiconductor device, the method including: depositing a hard mask layer over a work function layer over a semiconductor fin; depositing a bottom anti-reflective layer over the hard mask layer; patterning the bottom anti-reflective layer; treating the bottom anti-reflective layer, wherein the treating the bottom anti-reflective layer reduces a diffusibility of a first etchant through the bottom anti-reflective layer; and removing a portion of the hard mask layer with the first etchant while the bottom anti-reflective layer is present. In an embodiment the hard mask layer comprises aluminum oxide. In an embodiment the work function layer comprises lanthanum oxide. In an embodiment the treating the bottom anti-reflective layer is a physical treatment. In an embodiment the physical treatment applies isopropyl alcohol to the bottom anti-reflective layer. In an embodiment the treating the bottom anti-reflective layer is a chemical treatment. In an embodiment the chemical treatment forms a protective layer at least partially within the bottom anti-reflective layer.

In yet another embodiment, a method of manufacturing a semiconductor device, the method includes: depositing a layer of lanthanum oxide over a semiconductor fin; depositing a layer of aluminum oxide over the layer of lanthanum oxide; placing a bottom anti-reflective layer over the layer of aluminum oxide; patterning the bottom anti-reflective layer; adding material into the bottom anti-reflective layer after the patterning the bottom anti-reflective layer; etching a portion of the layer of aluminum oxide while the bottom anti-reflective layer is present; and etching a portion of the layer of lanthanum oxide while the bottom anti-reflective layer is present. In an embodiment, the etching the portion of the layer of aluminum oxide is performed at least in part with ammonium hydroxide. In an embodiment, the etching the portion of the layer of lanthanum oxide is performed at least in part with hydrochloric acid. In an embodiment, the adding material adds isopropyl alcohol. In an embodiment, the adding material reacts the bottom anti-reflective layer with a first reactant. In an embodiment, the first reactant is hexamethyldisilazane.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:

forming a first layer over a raised semiconductor region;

applying a bottom anti-reflective layer over the first layer, the bottom anti-reflective layer having a first diffusibility with respect to a first chemical, the bottom anti-reflective layer comprising a polymer with a chromophore group;

patterning the bottom anti-reflective layer;

reducing the first diffusibility to a second diffusibility with respect to the first chemical, wherein the reducing the first diffusibility to the second diffusibility comprises applying either isopropyl alcohol or hexamethyldisilazane to the bottom anti-reflective layer; and removing a portion of the first layer using the first chemical while the bottom anti-reflective layer is present.

2. The method of claim 1, wherein the reducing the first diffusibility is done at least in part with a physical process.

3. The method of claim 2, wherein the physical process fills pores of the bottom anti-reflective layer with a second chemical.

4. The method of claim 3, wherein the second chemical comprises the isopropyl alcohol.

5. The method of claim 1, wherein the reducing the first diffusibility is done at least in part with a chemical process.

6. The method of claim 5, wherein the chemical process reacts a portion of the bottom anti-reflective layer with a first reactant.

7. The method of claim 6, wherein the first reactant is the hexamethyldisilazane.

8. A method of manufacturing a semiconductor device, the method comprising:

depositing a hard mask layer over a work function layer over a semiconductor fin;

depositing a bottom anti-reflective layer over the hard mask layer;

patterning the bottom anti-reflective layer;

treating the bottom anti-reflective layer, wherein the treating the bottom anti-reflective layer reduces a diffusibility of a first etchant through the bottom anti-reflective layer; and removing a portion of the hard mask layer with the first etchant while the bottom anti-reflective layer is present.

9. The method of claim 8, wherein the hard mask layer comprises aluminum oxide.

10. The method of claim 9, wherein the work function layer comprises lanthanum oxide.

11. The method of claim 8, wherein the treating the bottom anti-reflective layer is a physical treatment.

12. The method of claim 11, wherein the physical treatment applies isopropyl alcohol to the bottom anti-reflective layer.

13. The method of claim 8, wherein the treating the bottom anti-reflective layer is a chemical treatment.

14. The method of claim 13, wherein the chemical treatment forms a protective layer at least partially within the bottom anti-reflective layer.

15. A method of manufacturing a semiconductor device, the method comprising:

depositing a layer of lanthanum oxide over a semiconductor fin;

depositing a layer of aluminum oxide over the layer of lanthanum oxide;

placing a bottom anti-reflective layer over the layer of aluminum oxide;

patterning the bottom anti-reflective layer;

adding material into the bottom anti-reflective layer after the patterning the bottom anti-reflective layer;

etching a portion of the layer of aluminum oxide while the bottom anti-reflective layer is present; and etching a portion of the layer of lanthanum oxide while the bottom anti-reflective layer is present.

16. The method of claim 15, wherein the etching the portion of the layer of aluminum oxide is performed at least in part with ammonium hydroxide.

17. The method of claim 15, wherein the etching the portion of the layer of lanthanum oxide is performed at least in part with hydrochloric acid.

18. The method of claim 15, wherein the adding material adds isopropyl alcohol.

19. The method of claim 15, wherein the adding material reacts the bottom anti-reflective layer with a first reactant.

20. The method of claim 19, wherein the first reactant is hexamethyldisilazane.

* * * * *